(12) United States Patent
Henzler et al.

(10) Patent No.: US 10,348,247 B2
(45) Date of Patent: Jul. 9, 2019

(54) GENERATING POWER SUPPLY SIGNALS FOR A PLURALITY OF RF POWER AMPLIFIERS

(71) Applicant: Intel IP Corporation, Santa Clara, CA (US)

(72) Inventors: Stephan Henzler, Munich (DE);
Johannes Harrebek, Aalborg (DK);
Christian Kranz, Ratingen (DE);
Holger Wenske, Freising (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/352,743

(22) Filed: Nov. 16, 2016

(65) Prior Publication Data
US 2017/0179887 A1    Jun. 22, 2017

(30) Foreign Application Priority Data
Dec. 21, 2015  (EP) .................................... 15201623

(51) Int. Cl.
*H03F 3/04*    (2006.01)
*H03F 1/02*    (2006.01)
(Continued)

(52) U.S. Cl.
CPC .......... *H03F 1/0216* (2013.01); *H03F 1/025* (2013.01); *H03F 1/0222* (2013.01); *H03F 3/19* (2013.01); *H03F 3/195* (2013.01); *H03F 3/21* (2013.01); *H03F 3/245* (2013.01); *H04B 1/04* (2013.01); *H03F 2200/102* (2013.01); *H03F 2200/432* (2013.01); *H03F 2200/451* (2013.01); *H03F 2200/504* (2013.01); *H03F 2200/507* (2013.01); *H03F 2200/511* (2013.01); *H03F 2200/516* (2013.01)

(58) Field of Classification Search
CPC ............. H03F 1/0216; H03F 3/21; H03F 3/19
USPC ......................................... 330/297, 127, 136
See application file for complete search history.

(56) References Cited

U.S. PATENT DOCUMENTS

2014/0118065 A1   5/2014  Briffa et al.
2015/0098523 A1   4/2015  Lim et al.

FOREIGN PATENT DOCUMENTS

GB         2510394 A      8/2014

OTHER PUBLICATIONS

"European Application Serial No. 15201623.4, Extended European Search Report dated Jun. 23, 2016", 9 pgs.

*Primary Examiner* — Khanh V Nguyen
*Assistant Examiner* — Khiem Nguyen
(74) *Attorney, Agent, or Firm* — Schwegman Lundberg & Woessner, P.A.

(57) ABSTRACT

An apparatus for generating a plurality of power supply signals for a plurality of power amplifiers configured to amplify radio frequency transmit signals includes a first power supply circuit configured to generate a first power supply signal and a different second power supply signal. The first power supply circuit is configured to provide the first power supply signal to a first output path and the second power supply signal to a second output path. Further, the apparatus includes a second power supply circuit configured to generate a third power supply signal. Still further, the apparatus includes a switching circuit configured to couple the second power supply circuit to the first output path in a first operating mode to provide a first combined power supply signal at an output of the first output path based on the first power supply signal and the third power supply signal.

20 Claims, 11 Drawing Sheets

(51) Int. Cl.
*H03F 3/19* (2006.01)
*H03F 3/21* (2006.01)
*H04B 1/04* (2006.01)
*H03F 3/195* (2006.01)
*H03F 3/24* (2006.01)

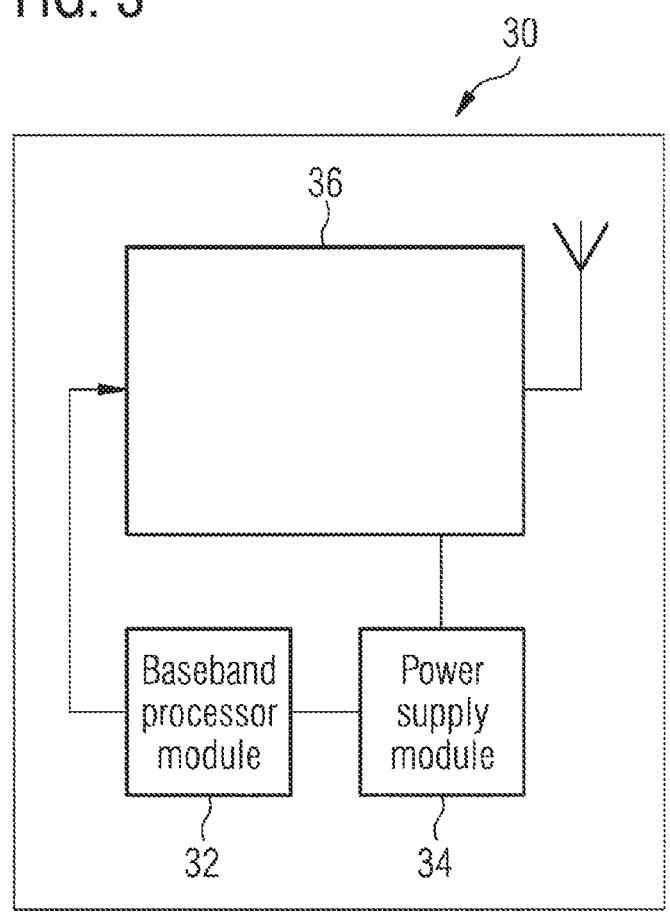

GENERATING POWER SUPPLY SIGNALS FOR A PLURALITY OF RF POWER AMPLIFIERS

CROSS REFERENCE TO RELATED APPLICATIONS

This application claims the benefit of priority to European Patent Application No. 15201623.4, filed Dec. 21, 2015, which is incorporated herein by reference in its entirety.

TECHNICAL FIELD

The present disclosure relates to radio frequency signal generation and in particular to an apparatus for generating a plurality of power supply signals for a plurality of power amplifiers configured to amplify radio frequency transmit signals.

BACKGROUND

In cellular transceiver systems with features such as uplink carrier aggregation or MIMO, two different power amplifiers may be supplied with an average power tracking signal (APT) or an envelope tracking (ET) signal. Which signal type is chosen depends upon the current use case. One approach would be to have two full RF PMICS (radio frequency power management integrated circuit) which can generate either of the two power supply signal types. This approach carries with it unattractive material costs and PCB (printed circuit board) area usage. Alternatively, a full tracker can be extended by adding a voltage regulator which can generate an APT signal only. While this alternative does save on PCB area and costs, the power amplifiers attached thereto can operate in an APT mode only and never in an ET mode. This alternative may be unattractive for use cases where no carrier aggregation is active.

BRIEF DESCRIPTION OF THE FIGURES

Some examples of apparatuses and/or methods will be described in the following by way of example only, and with reference to the accompanying figures, in which

FIG. 3 shows a block diagram of a mobile device;

DETAILED DESCRIPTION

Figure 1A:
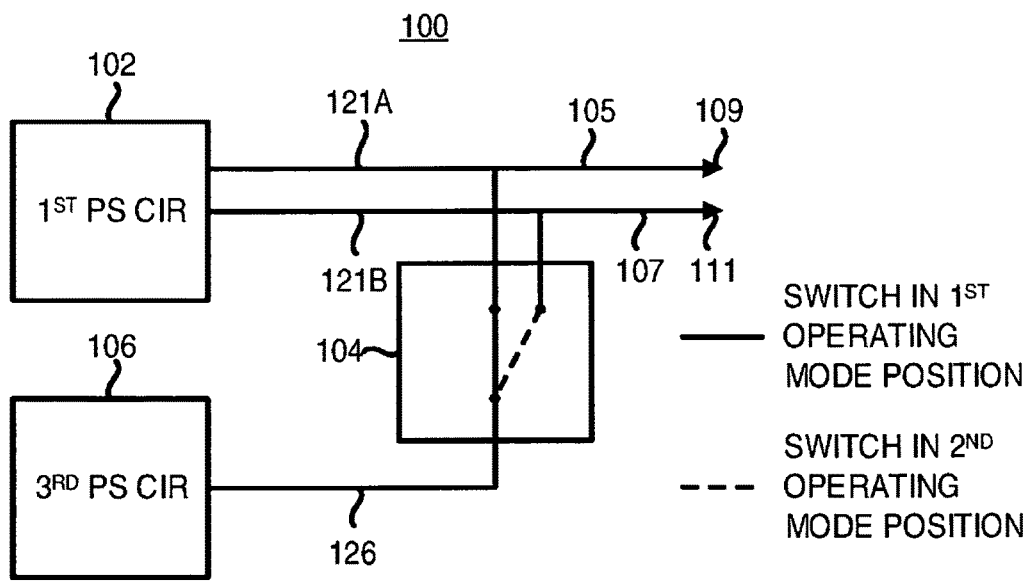
FIG. 1A shows block diagram of an apparatus for providing a plurality of power supply signals.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or component signals, but do not preclude the presence or addition of one or more other features, integers, steps, operations, elements, component signals and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following, various examples relate to devices (e.g., cell phone, base station) or components (e.g., transmitter, transceiver) of devices used in wireless or mobile communications systems. A mobile communication system may, for example, correspond to one of the mobile communication systems standardized by the 3rd Generation Partnership Project (3GPP), e.g., Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (EUTRAN), Long Term Evolution (LTE) or LTE-Advanced (LTE-A), or mobile communication systems with different standards, e.g., Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 3 shows a schematic illustration of a mobile device 30 according to an example. The mobile device may comprise a cell phone capable of making and receiving wireless phone calls, and transmitting and receiving data. The mobile device may be a smart phone that, in addition to making and receiving phone calls, runs any number or types of applications. The mobile device may be any device that transmits and receives information, including but not limited to a drive assistance module in a vehicle, an emergency transponder, a computer system and the like. The mobile device comprises an apparatus 36 for generating a transmit signal, and a baseband processor module 32 for generating a baseband transmit signal and providing the baseband transmit signal to the apparatus 36 for generating a transmit signal. Additionally, the mobile device comprises a power supply unit 34 supplying at least the apparatus 36 and the baseband processor module 32 with power. Further, the mobile device 30 comprises an antenna connected to the apparatus 36 for generating a transmit signal to transmit a high frequency transmit signal provided by the apparatus 36 for generating a transmit signal.

Modern redefined user experience from mobile devices may require high data rates which may be achieved with complex RF modulation and higher average output power. This may result in reduced efficiency for traditional RF power amplifiers (PA) to unacceptable levels. The reduced efficiency may take the form of thermal dissipation along with reduced battery lifetime. To address this, the power consumption by PAs may be reduced during transmission which, in turn, result in increased efficiency along with reduced heat and extended battery life. One approach to reduction of power consumption by PAs is average power tracking (APT).

Figure 4A:
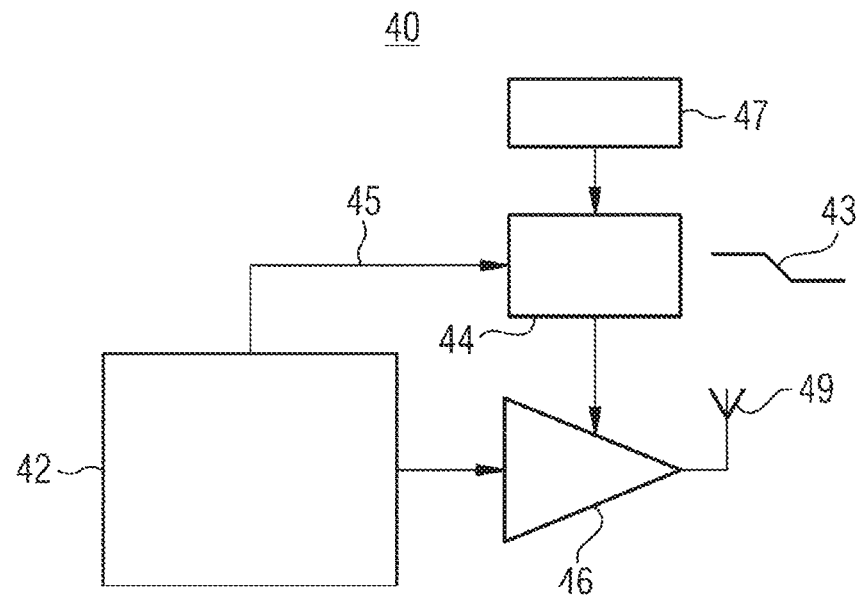
FIG. 4A shows a schematic APT circuit structure.

FIG. 4A depicts a schematic APT circuit structure 40 having a transceiver 42 configured to generate an amplifier power supply control signal 45 and supply the amplifier power supply control signal 45 to an APT voltage regulator, e.g., DC/DC converter 44. The Transceiver 42 is further configured to generate an RF signal for transmission and to supply the RF signal to an RF PA 46 for subsequent transmission via an antenna 49. A power source 47 is also coupled to the DC/DC converter 44 for effecting operation of the DC/DC converter 44. The DC/DC converter 44 is coupled to the PA 46 to provide the PA 46 with an APT power supply voltage signal 43 based on the amplified power supply control signal. APT power supply voltage signal 43 then dynamically drives the gain of the PA based on the PA average output power as measured over a given timeslot or frame. When the PA output power is below a maximum, the APT power supply voltage signal 43 is reduced and PA efficiency is thus improved. Adjustments in supply voltage are made whenever average output power changes. A high conversion efficiency DC/DC converter may be useful in obtaining a lowest system-level current consumption.

At times it may be desired to have high peak-to-average power ratio (PAR) and high average output power. Under APT, the average power supply voltage signal at full output power cannot be reduced without sacrificing some linearity, for example. Here, another approach to power reduction is available, namely envelope tracking (ET) which uses a dynamic power amplifier supply voltage which tracks the RF modulation amplitude or instantaneous output power levels instead of average output power level and applies the same to drive the gain of the PA.

Figure 4B:
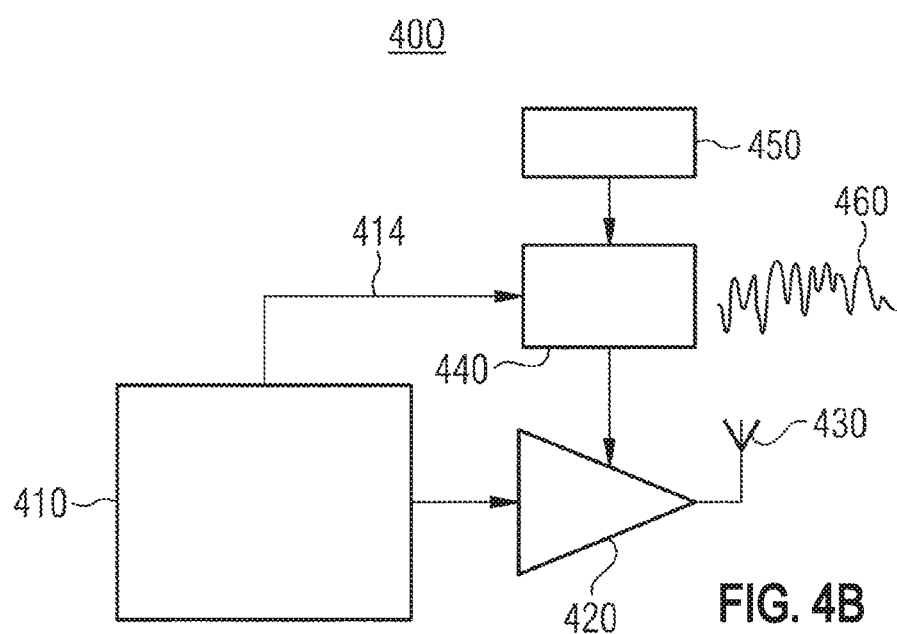
FIG. 4B shows a schematic ET circuit structure.

FIG. 4B depicts a schematic ET circuit structure 400. As shown, a transceiver 410 is configured to generate RF signals and supply the RF signals to a PA 420 for transmission via an antenna 430. Likewise, the transceiver 410 provides a voltage regulator, e.g., DC/DC converter 440 with a corresponding (to the RF signals) envelope tracking power control signal 414. A power source 450 is coupled to the DC/DC converter 440 to power the DC/DC converter 440 which, in turn, is coupled to the PA 420 and drive the PA 420 via an ET power supply voltage signal 460 according to the power control signal 414 from the transceiver 410, for example.

Figure 5:
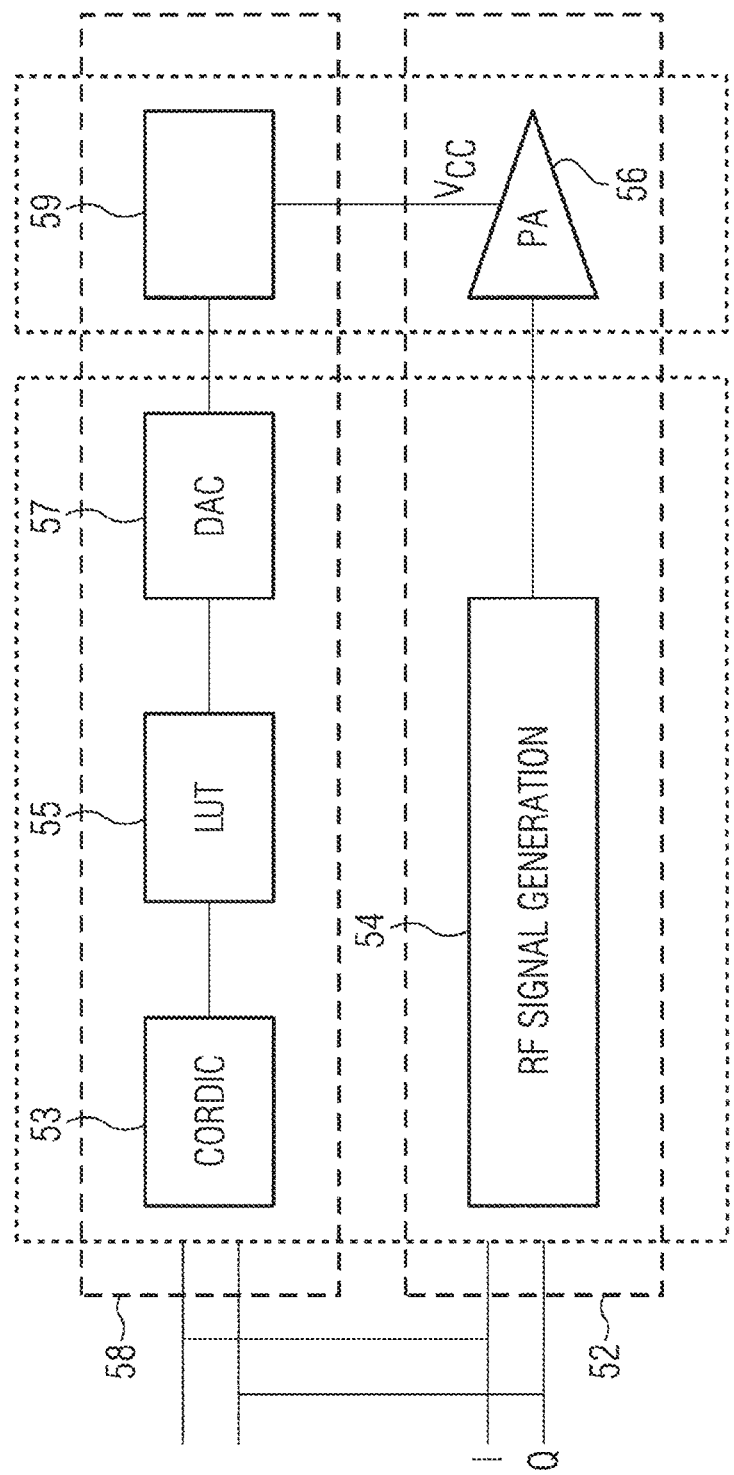
FIG. 5 shows a block diagram of an apparatus for generating a transmit signal with a transmit path and an enveloped tracking path.

FIG. 5 depicts a block diagram of an apparatus 50 for amplifying a transmit signal using an enveloped tracking (ET) approach according to an example. As shown, a transmit path 52 comprises an RF signal generation module 54 coupled to PA 56. An envelope tracking path 58 comprises a coordinate conversion module 53 (e.g., CORDIC coordinate rotation digital computer) coupled to a memory unit 55 (e.g., storing a Look Up Table, LUT) coupled to a digital to analog converter 57 (DAC) coupled 65 to an envelope tracking ET modulator 59 (e.g., power supply circuit comprising a DCDC converter) provides an envelope tracking power supply signal to the power amplifier 56.

In operation, a baseband transmit signal (e.g., in phase-quadrature signal IQ or polar modulated signal) is provided to the RF signal generation module 54 of the transmit path 52 and to the coordinate conversion module 53 of the envelope tracking path 58 (e.g., may be removed if the baseband transmit signal is a polar modulated signal). The RF signal generation module 54 converts the baseband transmit signal into a high frequency transmit signal (e.g., up-converting or mixing the baseband transmit signal with a carrier signal). The transmit signal is provided 51 to an input of the power amplifier 56 and is amplified by the power amplifier 56 based on a supply voltage Vcc provided 67 by the ET modulator module 59 of the envelope tracking path 58.

The coordinate conversion module 53 converts the inphase-quadrature baseband transmit signal to a polar modulated baseband transmit signal. A Look Up Table stored by a memory module 55 can provide a control signal or control parameters for adjusting a supply voltage provided by the ET modulator module 59 depending on an amplitude or magnitude of the baseband transmit signal. The output of the memory unit 55 may be digital to analog converted by the digital to analog converter 57 and the resulting analog power supply control signal may be provided to the ET modulator module 59.

The PA supply voltage Vcc may depend on the instantaneous envelope of the modulated baseband signal. In summary, the envelope of the modulated baseband signal may be calculated by means of a CORDIC algorithm and the envelope signal may be shaped (pre-distorted) and afterwards digital to analog converted. This signal may be applied to the ET DCDC converter (e.g., ultra-fast DCDC converter) which may generate the variable PA supply voltage.

Accordingly, an ET capable voltage regulator (also called a tracker) may follow the instantaneous envelope of the RF signal which may remove the voltage head room and may further increase the system efficiency (e.g., composite efficiency of PA and DCDC converter). For example, an ET capable DCDC converter may reduce the battery current drawn by a PA to amplify an LTE (Long Term Evolution) signal by roughly 20+% at maximum output power relative to a standard DCDC converter following the average power (APT).

Figure 6:
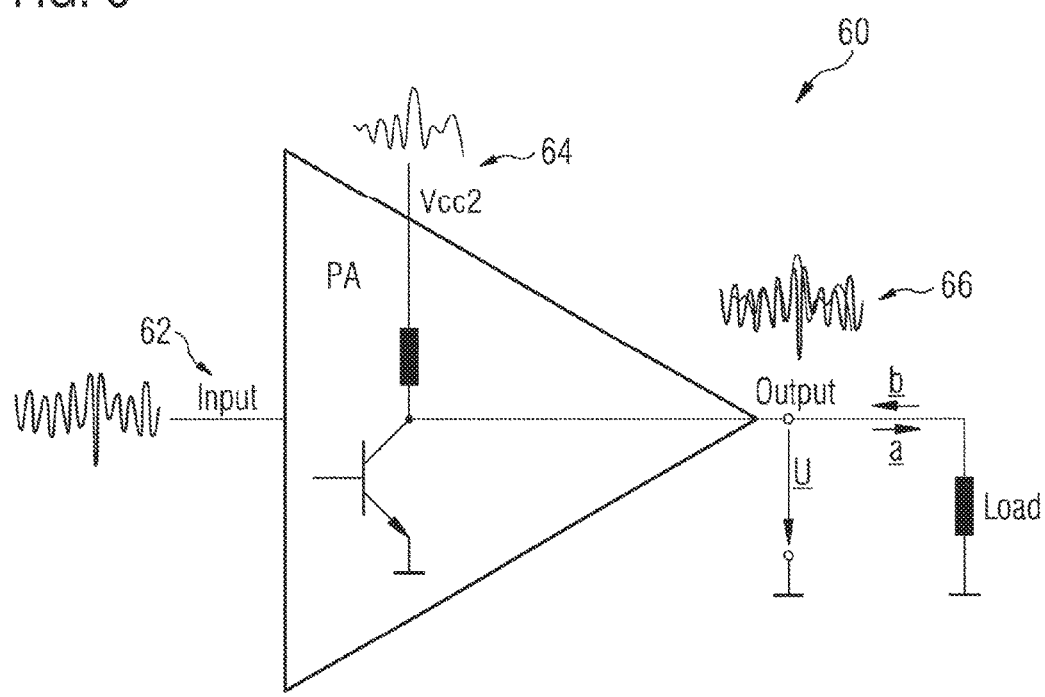
FIG. 6 shows a schematic illustration of an output stage of a power amplifier.

FIG. 6 shows a schematic illustration of a power amplifier 60 with an RF input 62, a supply voltage Vcc2 with modulating envelope 64 and an output signal 66. As depicted, the modulated supply voltage Vcc2 is applied to the collector of the last stage of the power amplifier from which, in addition, the output RF signal is taken. At this point, the power amplifier supply voltage generated by the envelope tracking path may be high enough and properly aligned in time to transmit the amplified RF envelope without or with negligible distortions.

ET may offer improved efficiency over APT for high-PAR modulation at high average output power. Additionally, PA heading may be reduced, PA linearity may be recovered and a maximum average output power capability due to enhanced PA efficiency and linearity may be enjoyed. However, ET may require higher bandwidth DC/DC converters and comes with a heightened sensitivity to noise than its APT counterpart. As such, ET may provide an efficient method for powering PAs when the transmitted signal has a high average output and high PAR. For lower average PA output power levels, APT may become a more desirable option. Providing either APT or ET output and accordingly either APT or ET power supply signals to power amplifiers may therefore be desirable.

Figure 7:
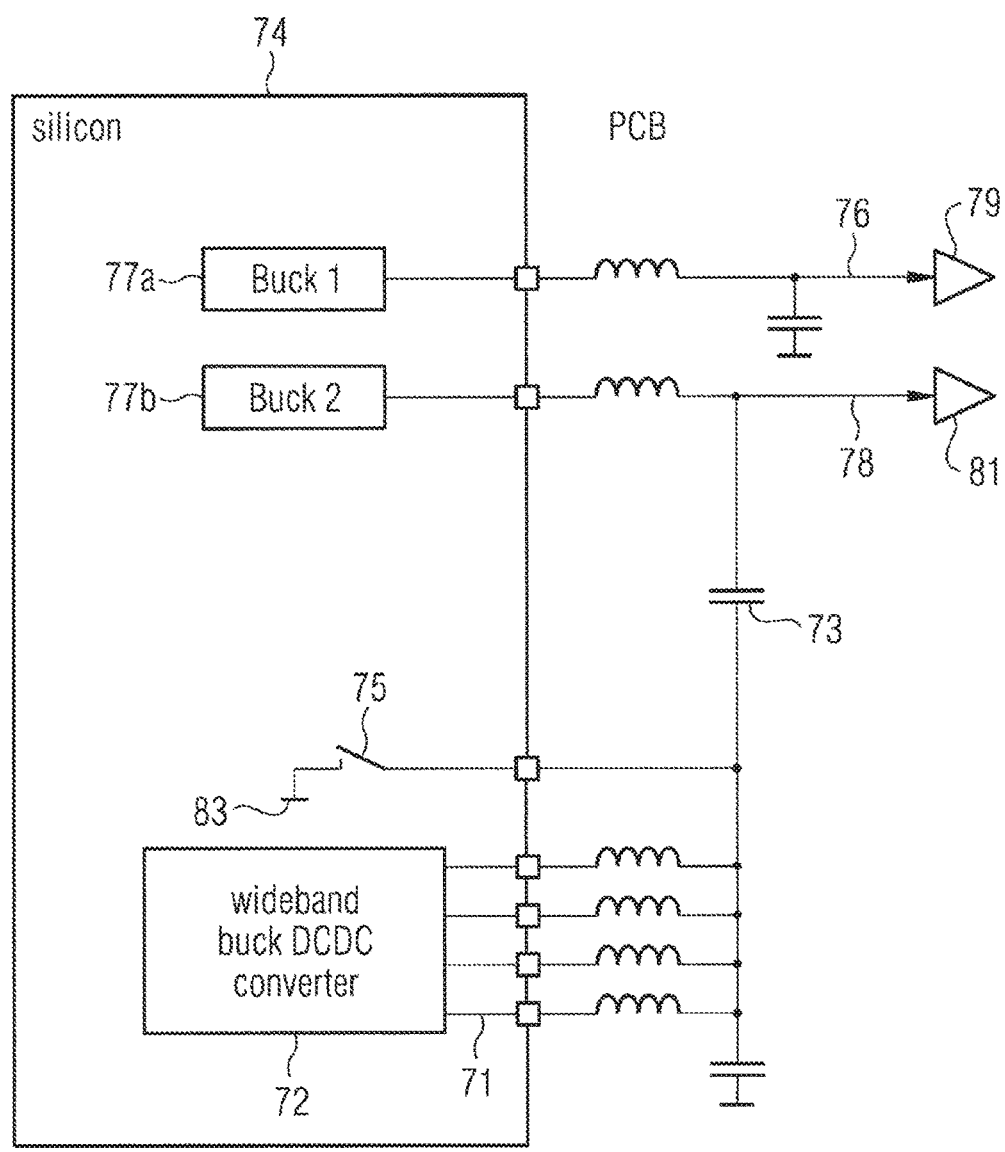
FIG. 7 shows a block diagram of an apparatus for providing power supply signals to power amplifiers.

FIG. 7 shows an apparatus 70 for providing power supply signals to power amplifiers which are configured to amplify radio frequency transmit signals. As depicted, the apparatus 70 comprises an APT circuit comprising a first DC/DC converter 77a and a second DC/DC converter 77b (e.g., buck converters) and an ET circuit comprising tracker (ET capable DC/DC converter, or wideband amplifier, or charge pump based amplifier) 72 (e.g., optionally integrated on the same silicon die 74). The APT circuit includes a first DC/DC converter 77a configured to generate a first APT power supply signal and provide the first APT power supply signal to a first output path 76. A first PA 79 or set of power amplifiers is arranged at the output of the first output path 76 and is configured to receive the first APT power supply signal. The first PA 79 may be arranged on a PCB outside the silicon. The APT circuit includes a second DC/DC converter 77b configured to generate a second APT power supply signal and provide the second APT power supply signal to a second output path 78. A second PA 81 or set of power amplifiers is configured to receive the second APT power supply signal and may be also arranged on a PCB outside the silicon.

The Tracker 72 includes a wideband signal generator such as a wideband DC/DC converter, wideband multi-phase DCDC converter, a wideband amplifier, or a wideband charge pump based amplifier, configured to generate an ET power supply signal on one or more output paths 71 coupled, via a shift capacitor 73, to the second output 78, to selectively deliver the ET power supply signal to the second PA 81 in place of the APT power supply signal from the second DC/DC converter 77b when switch 75 is open (as depicted). When switch 75 is set to ground 83, the output path of the second DC/DC converter 77b is effectively decoupled from the Tracker 72 resulting in second PA 81 being driven by the second APT power supply signal from the second DCDC converter 77b. The power amplifier at the output of the first output path 76 can only operate in APT, never in ET, even if the carrier aggregation is turned off and/or the power amplifier or amplifiers connected to the output of the second output page 78 are turned off. In this example, Buck 1 may be an APT DCDC converter and the PAs connected to this converter can never run in ET mode. Buck 2 and the wideband DCDC are coupled via a shift capacitor. The PAs connected to this converter combination can run either in APT or ET mode. In this example, all PAs connected to Buck 1 can never run in ET even if the Pas connected to Buck 2 are turned off.

FIG. 1A depicts an apparatus 100 for generating a plurality of power supply signals for a plurality of power amplifiers configured to amplify RF transmit signals according to an example. The apparatus 100 includes a first power supply circuit 102 which is used to generate a first power supply signal 121A and a different second power supply signal 121B. The first power supply circuit 102 is configured to provide the first power supply signal 121A to a first output path 105 and the second power supply signal 121B to a second output path 107. A third power supply circuit 106 is used for generating a third power supply signal 126. A switching circuit 104 is used for coupling the third power supply circuit 106 to the first output path 105, in a first operating mode, to provide a first combined power supply signal at an output 109 of the first output path 105. The first combined power supply signal is based on (e.g., a combination of) the first power supply signal 121A and the third power supply signal 126. The switching circuit 104 is also used to couple the third power supply circuit 106 to the second output path 107 in a second operating mode, to provide a second combined power supply signal at an output 111 of the second output path 107. The second combined power supply signal is based on (e.g., a combination of) the second power supply signal 121B and the third power supply signal 126.

The third power supply signal 126 of the third power supply circuit 126 can be provided to the first output path 105 or second output path 107 by the switching circuit 104. In this way the flexibility of the generation of power supply signals may be improved. For example, more sophisticated circuitry may be used for the third power supply circuit 106 than for the first power supply circuit 102, while being able to use power supply signals 126 generated by the third power supply circuit 106 for both output paths 105, 107 due to the switching circuit 104.

The first power supply circuit 102 may comprise a circuit configured to provide the two different power supply signals 121A, 121B at the same time. Alternatively, the first power supply circuit 102 comprises a first sub circuit (e.g., a DCDC converter, a buck converter, a buck converter with multiple input supply voltages or a buck boost converter) configured to generate the first power supply signal 121A and a second sub circuit (e.g., a DCDC converter, a buck converter, a buck converter with multiple input supply voltages or a buck boost converter) configured to generate the second power supply signal 121B. The first power supply signal 121A may be a voltage signal or a current signal. For example, the first sub circuit may operate in a voltage source mode to generate a voltage signal and in a current source mode to generate a current signal. Similarly, the second power supply signal 121B may be a voltage signal or a current signal. For example, the second sub circuit may operate in a voltage source mode to generate a voltage signal and in a current source mode to generate a current signal. The first sub circuit and the second sub circuit may be independent from each other switchable between voltage source mode and current source mode.

The third power supply circuit 106 provides the third power supply signal 126. The third power supply signal 126 may be a voltage signal. For example, the third power supply circuit 106 may operate in a voltage source mode to generate the third power supply signal 126. The third power supply circuit 106 may be a multi-phase power amplifier (e.g., class D amplifier) or also called a wideband buck DCDC converter.

The first output path 105 couples the first power supply circuit 102 (e.g., the first sub circuit) to the output of the first output path 105. The first output path 105 may comprise one or more elements (e.g., capacitor and/or inductor) being part of the first power supply circuit 102 or may be used by the first power supply circuit 102 for generating the first power supply signal 121A. Further, the first output path 105 comprises a node, which can be coupled to the third power supply circuit 106 by the switching circuit 104. For example, the first power supply signal 121A and the third power supply signal 121B may be combined at the node in the first output path 105 to obtain the first combined power supply signal at the output of the first output path 105, if the switching circuit couples the third power supply circuit 106 to the first output path 105 (first operating mode). For example, the first power supply signal 121A is a current signal and the third power supply signal 126 is a voltage signal during the first operating mode.

Further, in the first operating mode, the switching circuit 104 may be configured to decouple the third power supply circuit 106 from the second output path 107. Additionally, the first power supply circuit 102 may be configured to provide the second power supply signal 121B at the output 111 of the second output path 107 in the first operating mode. For example, the second power supply signal 121B may be a voltage signal in the first operating mode. In an example, an envelope tracking power supply signal (first combined power supply signal) may be provided at the output 109 of the first output path 105 and an average power supply signal (second power supply signal 121B) may be provided at the output 111 of the second output path 107 in the first operating mode.

The second output path 107 couples the first power supply circuit 102 (e.g., the second sub circuit) to the output 111 of the second output path 107. The second output path 107 may comprise one or more elements (e.g., capacitor and/or inductor) being part of the first power supply circuit 102 or may be used by the first power supply circuit 102 for generating the second power supply signal 121B. Further, the second output path 107 comprises a node, which can be coupled to the third power supply circuit 106 by the switching circuit 104. For example, the second power supply signal 121B and the third power supply signal 126 may be combined at the node in the second output path 107 to obtain the second combined power supply signal at the output 111 of the second output path 107, if the switching circuit 104 couples the third power supply circuit 106 to the second output path 107 (second operating mode). For example, the second power supply signal 121B is a current signal and the third power supply signal 126 is a voltage signal during the second operating mode.

Further, in the second operating mode, the switching circuit 104 may be configured to decouple the third power supply circuit 106 from the first output path 105. Additionally, the first power supply circuit 102 may be configured to provide the first power supply signal 121A at the output 109 of the first output path 105 in the second operating mode. For example, the first power supply signal 121A may be a voltage signal in the second operating mode. In an example, an envelope tracking power supply signal (second combined power supply signal) may be provided at the output 111 of the second output path 107 and an average power supply signal (first power supply signal 121A) may be provided at the output 109 of the first output path 105 in the second operating mode.

The outputs of the first output path 105 and the second output path 107 may be contact interfaces (e.g., pins, pads, solder areas or metal lines) for a connection to power supply inputs of power amplifiers. For example, the output 109 of the first output path 105 may be connected or coupled to at least one power amplifier of a first transmit path or a set of power amplifiers of a plurality of first transmit paths. Similarly, the output 111 of the second output path 107 may be connected or coupled to at least one power amplifier of a second transmit path or a set of power amplifiers of a plurality of second transmit paths.

For example, the first power supply circuit 102 may provide the first power supply signal 121A at the output of the first output path 105 and the second power supply signal 121B at the output of the second output path 107 in a third operating mode. The switching circuit may be configured to decouple the third power supply circuit 106 from the first output path 105 and the second output path 107 in the third operating mode. For example, the first power supply signal 121A and the second power supply signal 121B may be voltage signals in the third operating mode. In an example, a first average power supply signal (first power supply signal 121A) may be provided at the output of the first output path 105 and a second average power supply signal (second power supply signal 121B) may be provided at the output of the second output path 107 in the third operating mode. For example, the third power supply circuit 106 may be turned off in the third operating mode.

The switching circuit 104 may comprise a first switching structure arranged in a first connecting path between the third power supply circuit 106 and the first output path 105. The first switching structure (e.g., one or more transistors) may couple the third power supply circuit 106 to the first output path 105 in the first operating mode. Additionally, the switching circuit 104 may comprise a second switching structure arranged in a second connecting path between the third power supply circuit 106 and the second output path 107. The second switching structure (e.g., one or more transistors) may couple the third power supply circuit 106 to the second output path 107 in the second operating mode. Optionally, the switching circuit 104 may comprise a third switching structure (e.g., one or more transistors) arranged in a common connecting path portion of the first and the second connecting path. The third switching structure may switch the common connecting path portion to a reference potential (e.g., in the third operating mode).

The first power supply circuit 102 may be a switching amplifier using a first switching amplification circuit for generating the first power supply signal 121A and a second switching amplification circuit for generating the second power supply signal 121B. For example, the first power supply circuit 102 may be configured to generate the first power supply signal 121A and the second power 121B supply signal based on switching amplification circuits triggered by switching signals with frequencies lower than 15 megahertz (or less than 10 MHz, less than 5 MHz or less than 1 MHz). The switching signal provided to the first switching amplification circuit and the switching signal provided to the second first switching amplification circuit may comprise the same frequency. The switching signals may be rectangular signals (e.g., FIG. 8), for example. In other words, a switching frequency of the first power supply circuit 102 may be below 15 MHz. Further, the third power supply circuit 106 may be a switching amplifier using a switching amplification circuit for generating the third power supply signal 126. The third power supply circuit 106 may be configured to generate the third power supply signal 126 based on a switching amplification circuit triggered by a switching signal with a frequency higher than 50 megahertz (or higher than 100 MHz or higher than 200 MHz). In other words, a switching frequency of the third power supply circuit 106 may be higher than 50 MHz.

The apparatus 100 for generating a plurality of power supply signals may be a power supply device with at least a part of the power supply device being implemented on a semiconductor die. For example, at least a part of the first power supply circuit 102, at least a part of third power supply circuit 106 and at least a part of switching circuit 104 are arranged on a same semiconductor die (or on different semiconductor dies). Additionally, one or more parts (e.g., capacitors and/or inductors) of the first power supply circuit 102 and the third power supply circuit 106 may be arranged on a PCB and may be connected to the semiconductor die.

For example, the apparatus 100 may be a power supply device or envelope tracker for providing the power supply for the amplification of transmit signal in an uplink carrier aggregation transmission.

More details and aspects are mentioned in connection with the examples described above or below. The example shown in FIG. 1A may comprise one or more optional additional features corresponding to one or more aspects mentioned in connection with the proposed concept or one or more examples described above (e.g., FIGS. 3-7) or below (e.g., FIGS. 1B, 1C, 2 and 8-10).

Figure 1B:
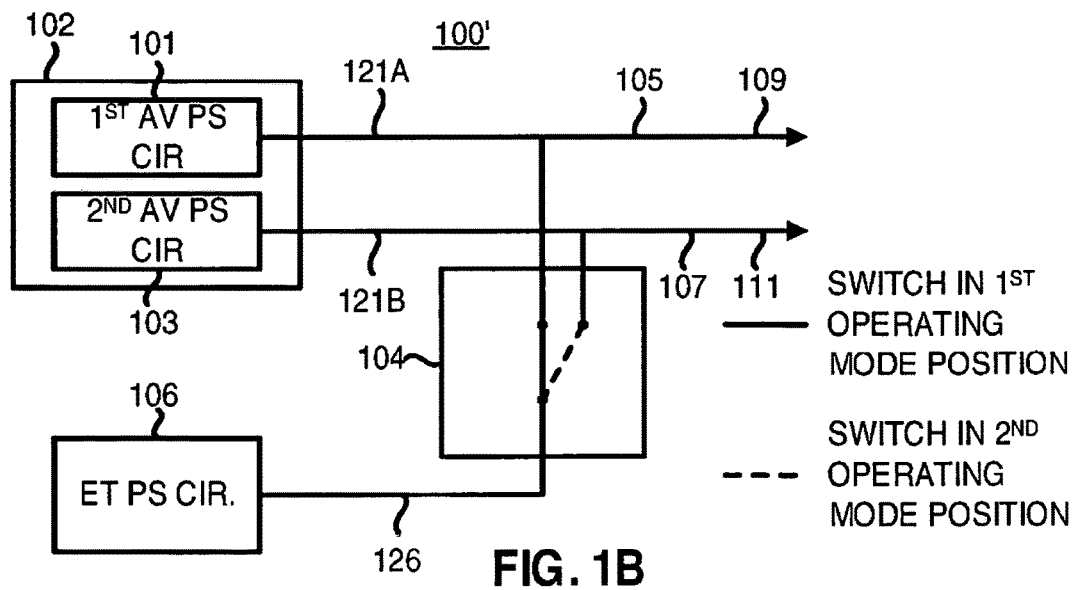
FIG. 1B shows another block diagram of another apparatus for providing a plurality of power supply signals.

FIG. 1B depicts an apparatus 100' for generating a plurality of power supply signals for a plurality of power amplifiers configured to amplify radio frequency transmit signals according to an example. The apparatus 100' includes a first average power supply circuit 101 connected to a first power supply output 109 and configured to generate a first average power supply signal 121A in a second operating mode. A second average power supply circuit 103 is connected to a second power supply output 111 and configured to generate a second average power supply signal 121B in a first operating mode. The first and second average power supply signals 121A, 121B are similar to those signals 121A, 121B shown in FIG. 1A. Further, the apparatus 100' comprises an envelope tracking power supply circuit 106, similar to the third power supply circuit 106 shown in FIG. 1A configured to generate an envelope tracking power supply signal 126 similar to the third power supply signal 126 shown in FIG. 1A, and a switching circuit 104 configured to couple the envelope tracking power supply circuit 106 to the first power supply output 109 in the first operating mode to provide an envelope tracking power supply signal 126 at the first power supply output 109. The switching circuit 104 is further configured to couple the envelope tracking power supply circuit 106 to the second power supply output 111 in the second operating mode to provide an envelope tracking power supply signal 126 at the second power supply output 111.

The envelope tracking power supply circuit 106 can be coupled to the first 105 or second 107 output path by the switching circuit 140. In this way the flexibility of the generation of power supply signals may be improved. For example, more sophisticated circuitry may be used for the envelope tracking power supply circuit 106 than for the first average power supply circuit 101. Nevertheless, the envelope tracking power supply signal 126 generated by the envelope tracking power supply circuit 106 may be used for both output paths 105, 107 due to the switching circuit 104.

More details and aspects are mentioned in connection with the examples described above or below. The example shown in FIG. 1B may comprise one or more optional additional features corresponding to one or more aspects mentioned in connection with the proposed concept or one or more examples described above (e.g., FIGS. 1A and 3-7) or below (e.g., FIGS. 1C, 2 and 8-10).

Figure 1C:
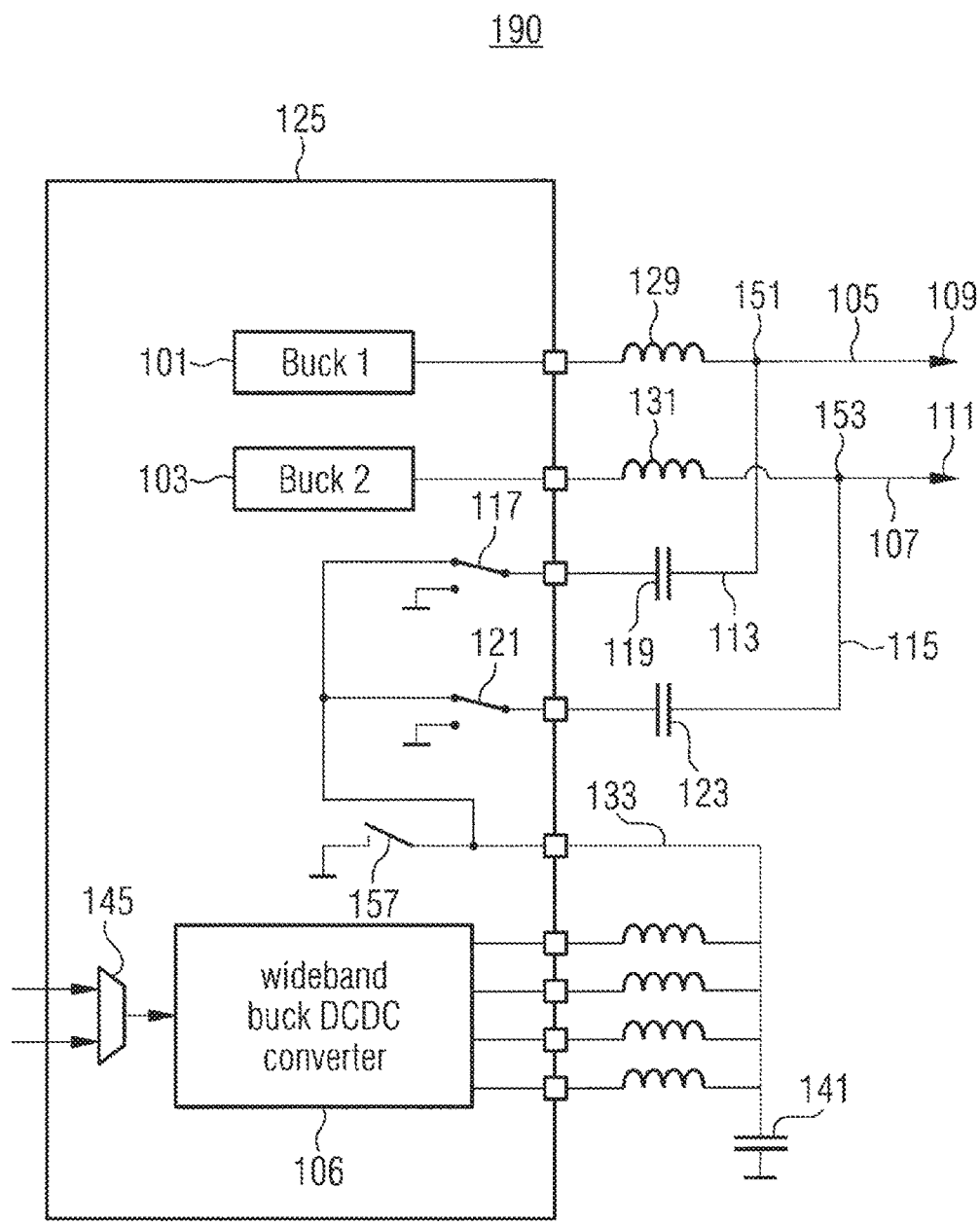
FIG. 1C shows a block diagram of an apparatus for providing a plurality of power supply signals with two buck converters and a wideband converter.

FIG. 1C shows a block diagram of an apparatus 190 for providing a plurality of power supply signals with two buck converters and a wideband converter according to an example. As depicted, the first power supply circuit includes a first sub circuit implemented by a first DC/DC converter 101 (e.g., buck1) and a second sub circuit implemented by a second DC/DC converter 103 (e.g., buck2) which are used to generate different average power tracking (APT) power supply signals based upon received APT control signals which in turn are based upon RF signals to be transmitted over a first and a second transmit path (not shown). Each of the first DC/DC converter 101 and second DC/DC converter 103 may be a buck converter, a slow buck converter, a buck boost converter or a buck converter with multiple input supply voltages.

The first DC/DC converter 101 is connected with the first output path 105 and the second DC/DC converter 103 is connected with the second output path 107. A first inductor 129 is arranged on the first output path 105 and a second inductor 131 is arranged on the second output path 107. Both the first inductor 129 and the second inductor 131 may be arranged on PCB 127 and are configured to remove high-frequency noise and otherwise pass direct current, for example. An output 109 of the first output path 105 is connected or coupled to a first PA or a first set of PAs (e.g., PA set 1). The first PA may be part of a first transmit path for transmitting RF transmit signals (not shown). An output 111 of the second output path 105 is connected or coupled to a second PA or a second set of PAs (e.g., PA set 2). The second PA may be part of a second transmit path for transmitting RF transmit signals (not shown). In an example, either the first PA set 1 may be in AP mode and the second PA set 2 may be in ET mode or vice versa. Each one of the two output paths 105, 107 may be connected to one or more power amplifiers. On each line, a complete set of power amplifiers may be possible.

The third power supply circuit 106 includes a third DC/DC converter, which may be a wideband DC/DC converter, and which is used to generate envelope tracking (ET) power supply signals based on ET control signals which in turn are based upon RF signals to be transmitted by the first or the second transmit path (not shown). The third DC/DC converter may be a multi-phase power amplifier (e.g., class D amplifier) configured to generate a power supply signal based on a switching amplification circuit triggered by a switching signal with frequencies higher than 50 MHz.

The third DC/DC converter is depicted coupled to a number of signal paths (e.g., four paths for a 4-phase DC/DC converter), each having an inductor arranged thereon. The number of phase paths may vary with four being depicted by way of an example. A multiplexer 145 may be used to receive a first ET control signal (envelope input 1) and a second ET control signal (envelope input 2), to select one of the first and second ET control signals, based upon a selection control signal, and provide the selected control signal as input to the third DC/DC converter 106. For example, the first and second ET control signals are first and second target envelope signals according to respective first and second RF transmit signals. The power supply signal generated by the third DC/DC converter in response to the first ET control signal is intended for the first output path 105 and the power supply signal generated by the DC/DC converter in response to the second ET control signal is intended for the second output path 107.

The switching circuit 101 includes a first connecting path 113 and a second connecting path 115, both of which share a common connecting path portion 133. The first connecting path 113 is connected at one end with the phase paths of the third DC/DC converter 106 (via common connecting path portion 133) and at the other end to a node 151 on the first output path 105. The node 151 is arranged on the first output path 105 between first inductor 129 and first power supply output 109. The second connecting path 115 is connected at one end with the phase paths of the third DC/DC converter 106 (via common connecting path portion 133) and at the other end to another node 153 on the second output path 107. The another node 153 is arranged on the second output path 107 between second inductor 131 and the output of the second output path 111.

A first switch 117 and a first capacitor 119 are arranged on the first connecting path 113. The first switch 117 is positioned on the silicon die 125 and the first capacitor 119 is a switched capacitor, for example. The first switch 117 has a first closed position (as shown) where the first switch is connected to the first connecting path 113 thereby closing it and effectively coupling the phase paths with first output path 105 and a second open position (not shown) where the first switch 117 is connected to a ground 118 thereby opening the first connecting path 113 and effectively decoupling the phase paths from the first output path 105 such that only the output of the first DC/DC converter 101 is received at the output of the first output path 109. The first switch 117 includes an input (e.g., gate of transistor) for controlling which position to take.

A second switch 121 and a second capacitor 123 are arranged on the second connecting path 115. The second switch 121 is positioned on the silicon die 125 and the second capacitor 123 is a switched capacitor, for example. The second switch 121 has a first closed position (as shown) where the second switch 121 is connected to the second connecting path 115 thereby closing it and effectively coupling the phase paths with second output path 107 and a second open position (not shown) where the second switch 121 is connected to a ground 120 thereby opening the second connecting path 115 and effectively decoupling the phase paths from the second output path 107 such that only the output of the second DC/DC converter 103 is received at the output of the second output path 111. The second switch 121 includes an input (e.g., gate of transistor) for controlling which position to take.

A third switch 157 is arranged on the common connecting path portion 133. The third switch 157 is positioned on the silicon die 125 and has a first open position (as shown) where the third switch 157 is open thereby effectively coupling the phase paths with the first connecting path 113 and the second connecting path 115 and a second closed position (not shown) where the third switch 157 is connected to a reference potential (e.g., ground), thereby opening the common connecting path portion 133 and effectively decoupling the phase paths from the first connecting path 113 and the second connecting path 115 such that only the output of the first DC/DC converter 101 is received at the output of the first output path 109 and only the output of the second DC/DC converter 103 is received at the output of the second output path 111, for example. The third switch 157 includes an input (e.g., gate of transistor) for controlling which position to take.

A capacitor 141 is arranged between the common connecting path portion 133 and a reference potential. The capacitor 141 together with the inductors of the phase paths may be configured to filter out undesirable frequencies.

For example, in the first operating mode, the switching circuit 104 is used to decouple the third power supply circuit 106 from the second output path 107 so that the first power supply circuit 102 can be used to provide the second power supply signal 121B at the output 111 of the second output path 107 in the first operating mode. In the second operating mode, the switching circuit 104 is used to decouple the third power supply circuit 106 from the first output path 105 so that the first power supply circuit 102 can be used to provide the first power supply signal 121A at the output 109 of the first output path 105 in the second operating mode.

In order to effect the first power combined signal, in the first operating mode, the first power supply signal 121A is a current signal and the second and third power supply signals are voltage signals. In order to effect the second power combined signal, in the second operating mode, the first power supply signal 121A is a voltage signal and the second power supply signal 121B and third power supply signal 126 are current signals. Control signals may be provided to the first power supply circuit 102 and third power supply circuit 106 to control how the various power supply signals are generated.

In a third operating mode, the switching circuit 104 is used to decouple the third power supply circuit 106 from the first output path 105 and the second output path 107 so that the first power supply circuit provides the first power supply signal 121A to the first output and the second power supply signal 121B to the second output. In the third operating mode, the first and second power supply signals are voltage signals.

The first combined power supply signal and the second combined power supply signal may be envelope tracking power supply signals. In an example, the first power supply signal 121A and the second power supply signal 121B may be DC signals and the third power supply signal 126 may be an AC signal.

The first power supply circuit 102, the third power supply circuit 106 and at least part of the switching circuit 104 may be arranged on a same silicon die 125. Alternatively, the same silicon die may be made to include a number of other elements as will be discussed herein below. The silicon die 125 may be a semiconductor die and arranged in a power supply device, transmitter or transceiver, a mobile device comprising the transmitter or transceiver, or a smart phone comprising the transmitter or transceiver.

Both slow DCDCs Buck 1 101 and Buck 2 103 have a floating cap instead of grounded caps. These caps can be used as shift caps and are connected to the silicon. Inside the silicon the wideband DCDC can be connected either to the one or to the other. The respective other cap is grounded. In this way it is fully configurable which of the PA sets is running in ET and which one in APT mode. For example, in use cases without carrier aggregation any PA can run in ET.

Optionally, the apparatus 190 comprises the multiplexer 145. Therewith, the tracker can be used as connecting element between two separate transceiver chips and the set of power amplifiers, for example.

FIG. 1C may show a proposed architecture with additional input multiplexer for target envelope signals. These signals may come from one or two separate transceiver chips.

More details and aspects are mentioned in connection with the examples described above or below. The example shown in FIG. 1C may comprise one or more optional additional features corresponding to one or more aspects mentioned in connection with the proposed concept or one or more examples described above (e.g., FIGS. 1A, 1B and 3-7) or below (e.g., FIGS. 2 and 8-10).

Figure 2:
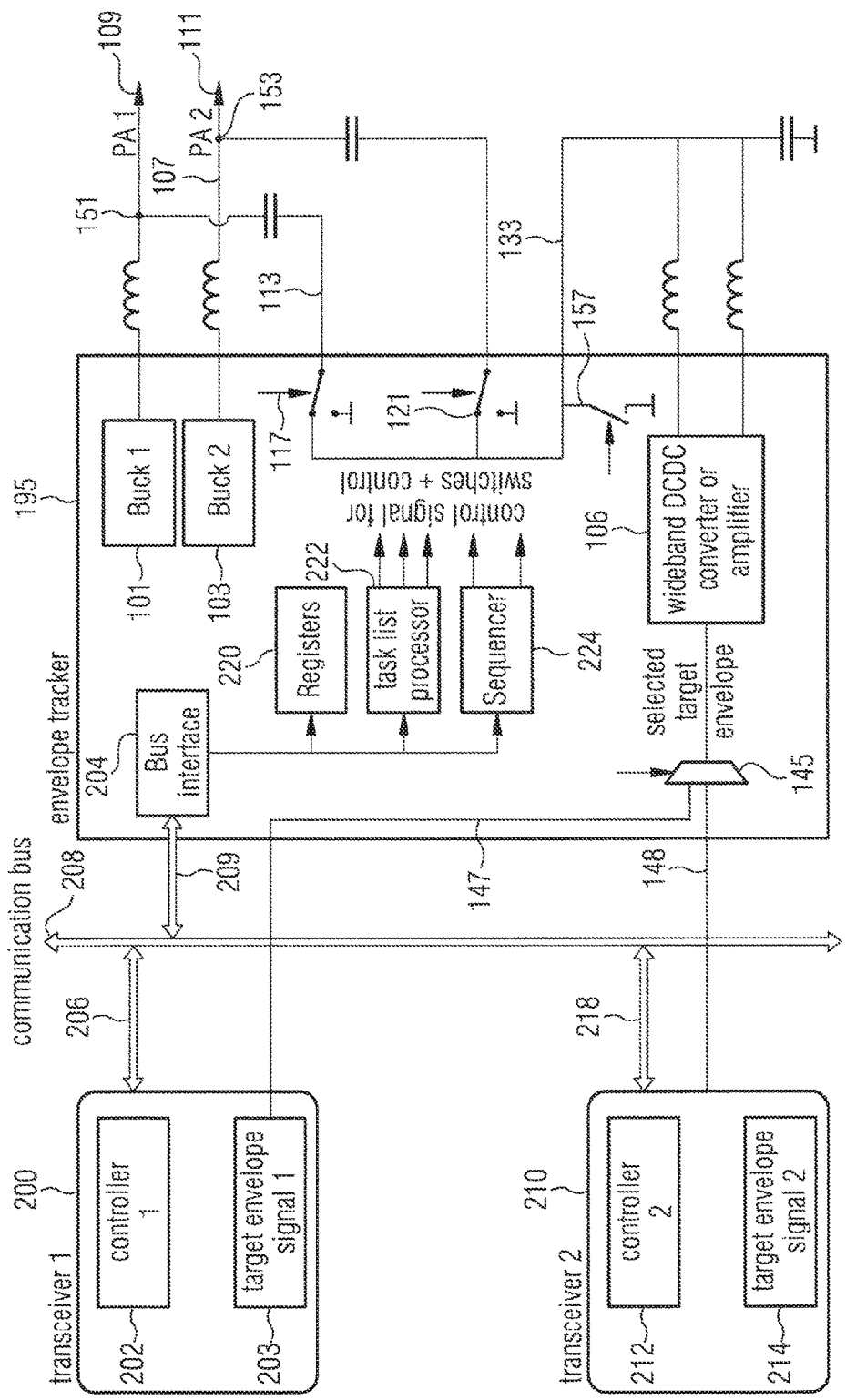
FIG. 2 shows a block diagram of a transceiver.

FIG. 2 shows a block diagram of a transceiver 290. As shown, a first transceiver 200 and a second transceiver 210 are in communication with an apparatus 195 for providing a plurality of power supply signals (or envelope tracker). The number of transceivers may vary by example depending upon the use case such as for transmitting at different frequencies (e.g., two for 900 MHz and 1800 MHz), for carrier aggregation or for customization (e.g., Bluetooth). The transceivers may generate control signals for the apparatus 195 to trigger a desired power supply for the power amplifiers of the transceivers. The implementation of the apparatus 195 for providing a plurality of power supply signals may be similar to the implantation shown in FIG. 1C. Additional features and details are described below.

The first transceiver 200 comprises a first controller 202, used for controlling the operation of the first transceiver 200 and a target envelope signal module 203 used for generating an ET first control signal. The first ET control signal is provided over a first control path 147 (or a communication bus 208) to a multiplexer 145. For example, the first transceiver 200 generates a first switching control signal used to control the switching circuit and a first APT control signal used by the first DC/DC converter 101 for generating the first power supply signal. Further, the first transceiver 200 may generate a target voltage signal (e.g., indicating a target voltage), an operation mode signal (e.g., indicating an operation mode of the internal converters) and/or control signals for switches which reconfigure the two bucks and/or the wideband, for example. The first APT control signal may relate to RF signals for amplification by a PA in the first transceiver 200 (e.g., first transmit path). The PA may be not inside the transceiver 200 but a discrete component. The RF input signal for this PA comes from the transceiver 200 and the supply signal for the PA comes from the apparatus 195. The first switching control signal and the first APT control signal are sent, by the first transceiver, over a communication bus 208 and onward to a bus interface 204 of the apparatus 195. The bus interface may be arranged on the same silicon die as the power supply circuits 101, 103, 106. From the bus interface 204, the first APT control signal is communicated to first DC/DC converter 101 to control the generation of the first power supply signal. From the bus interface 204, the first switching control signal is sent to registers 220, a task list processor 222 and a sequencer 224.

The second transceiver 210 comprises a second controller 212, used for controlling the operation of the second transceiver 210 and a target envelope signal module 214 used for generating a second ET control signal. The second ET control signal is provided over a second control path 148 (or a communication bus 208) to the multiplexer 145. For example, the second transceiver 210 generates a second switching control signal used to control the switching circuit and a second APT control signal used by the second DC/DC converter 103 for generating the second power supply signal. Further, the second transceiver 210 may generate a target voltage signal (e.g., indicating a target voltage), an operation mode signal (e.g., indicating an operation mode of the internal converters) and/or control signals for switches which reconfigure the two bucks and/or the wideband, for example. The second APT control signal may relate to RF signals for amplification by a PA in the second transceiver 210 (e.g., second transmit path). The second switching control signal and the second APT control signal are sent, by the second transceiver, over the communication bus 208 and onward to the bus interface 204 of the apparatus 195. From the bus interface 204, the second APT control signal is communicated to second DC/DC converter 103 to control the generation of the second power supply signal. From the bus interface 204, the second switching control signal is sent to the registers 220, the task list processor 222 and the sequencer 224. The multiplexer 145 may provide, based on a selection control signal, the first or second ET control signal as selected target envelope to the third power supply circuit 106 (e.g., wideband DCDC converter or amplifier) for generating the third power supply signal. The selection control signal may be generated by the task list processor 222 or the sequencer 224, for example.

The first and second switching control signals are sent from the bus interface 204 to the registers 220, the task list processor 222 and the sequencer 224 which then generate and send control signals for switches and control to the first switch 117, the second switch 121 and the third switch 157. The control signals control the switches to selectively open and close in accordance with implementing the desired operational mode. The registers 220 set parameters defining the mode of operation and the detailed behavior of the power supply circuit s, the control loops inside the power supply circuits and are used for configuration of analog and digital sub-circuits, for example. The task list processor 222 runs small control programs in real time which take care for the configuration of the different modes of operation, for example. For example, mode changes such as envelope tracking to average power tracking and back or the reconfiguration of the switches may require several steps of reconfiguration which are done step by step by the task list processor. The sequencer 224 may be an electronic device that sorts information into the required order for data processing such that in a sequence structure, an action, or event, leads to the next ordered action in a predetermined order. The sequencer may be used to introduce a different word than task list processor and otherwise refers to a control logic which organizes mode changes and changes of the switch configuration. The sequence may include any number of actions, but no action is normally skipped in the sequence. The program, when run, should perform each action in order with no possibility of skipping an action or branching off to another action.

For example, in the first operating mode: first switch 117 is closed; second switch 121 is set to ground; third switch 157 is open; multiplexer 145 is made to select the first ET control signal for input into the third power supply circuit 106 and the first power supply signal is a current signal. For example, in the second operating mode; first switch 117 is set to ground; second switch 121 is closed; third switch 157 is open; multiplexer 145 is made to select the second ET control signal for input the third power supply circuit 106 and the second power supply signal is a current signal. For example, in the third operating mode: first switch 117 is closed; second switch 121 is closed; third switch 157 is set to ground and the first power supply signal and the second power supply signal are voltage signals. Accordingly, with the switches so configured, in the first operating mode, the PA of the first transceiver 200 operates in an ET mode and the PA of the second transceiver 210 operates in an APT mode. In the second operating mode, the PA of the first transceiver 200 operates in an APT mode and the PA of the second transceiver 210 operates in APT mode. In the third mode, the PAs of both transceivers operate in APT mode.

More details and aspects are mentioned in connection with the examples described above or below. The example shown in FIG. 2 may comprise one or more optional additional features corresponding to one or more aspects mentioned in connection with the proposed concept or one or more examples described above (e.g., FIGS. 1A-1C and 3-7) or below (e.g., FIGS. 8-10).

Figure 8:
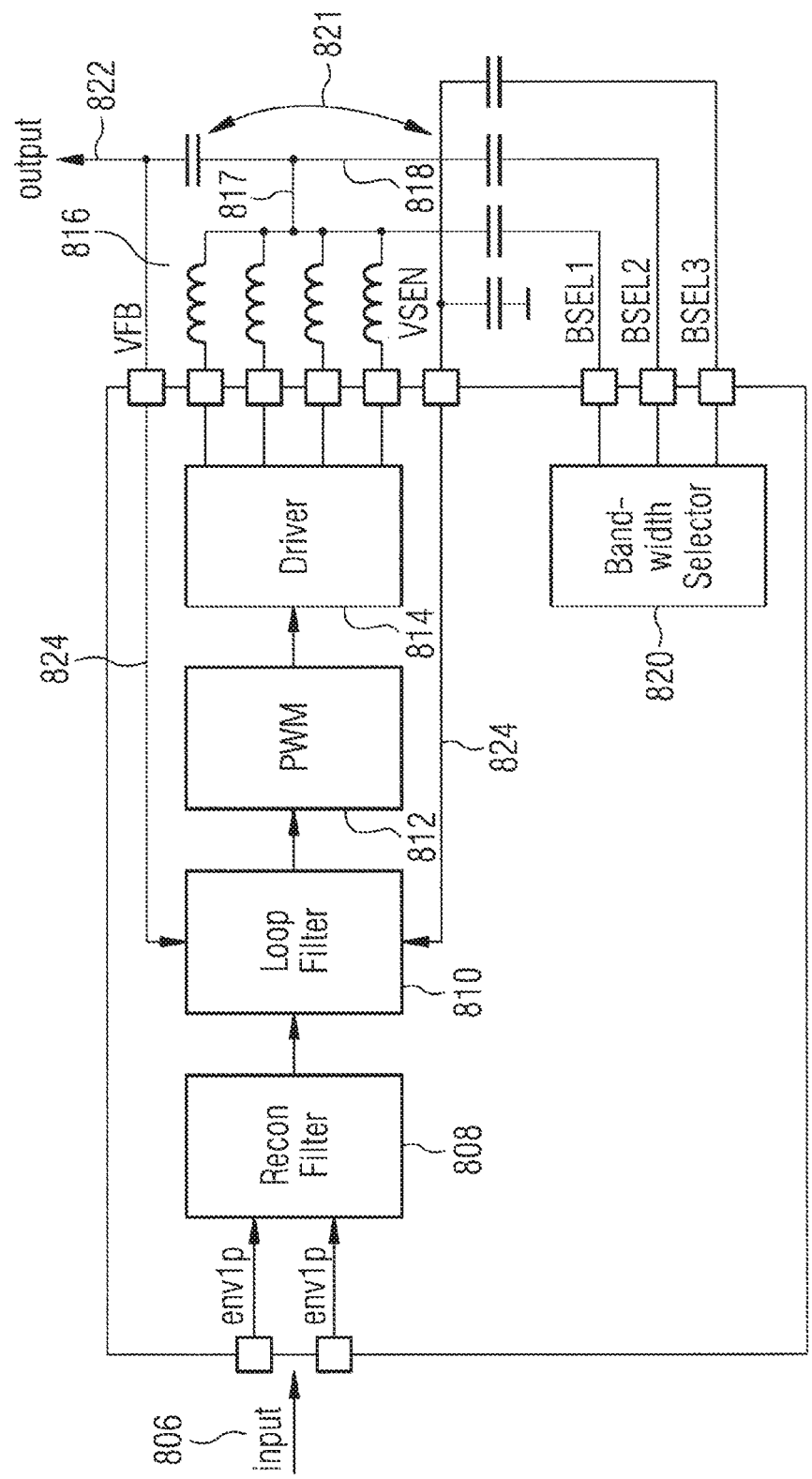
FIG. 8 depicts an example structure for the second power supply circuit.

FIG. 8 depicts an example structure for the third power supply circuit 106 which may be a digital 4-phase wide-band amplifier 800. The amplifier 800 may be a Class-D amplifier or switching amplifier wherein the amplifying devices operate as electronic switches. The signal to be amplified may be a train of constant amplitude pulses, so the active devices switch rapidly between fully conductive and nonconductive states. In the depicted example, the switching frequency in one phase may be 75-300 MHz with an overall switching frequency of 300-1200 MHz. The analog signal to be amplified is converted into a series of pulses before being applied to an amplifier. After amplification, the output pulse train will be converted back to an analog signal by passing it through a programmable low pass filter comprising inductors and capacitors. The amplifier 800 may comprise improved efficiency and less power dissipation through heat.

The amplifier structure 800 includes an input 806 for receiving differential envelope control signals env1$p$, env1$n$, which are provided to a reconstruction filter 808 (recon filter). The reconstruction filter 808 may be used to construct a smooth analog signal from digital input. The analog output signal from the reconstruction filter 808 is provided to a loop filter 810 The loop output signal is provided to a pulse width modulator (PWM) 812 which converts the incoming loop output signal into a series of pulses by making use of a high speed comparator that compares a high frequency triangular wave with the incoming analog output. The series of pulses output of the PWM may then be used to drive driver 814 which include an inverter arrangement such as MOS gate driver configured to drive a pair of high-power switches, such as MOSFETs. The driver output signal of driver 814 may be an amplified replica of the comparators PWM signal. Driver 814 is arranged with four output paths (consistent with the 4 phases), each having an inductor 816 and each converging onto a summing node 817 leading to a common output 822. Optionally, a bandwidth selector 820 is arranged to provide programmable filtering, via a number of capacitors 821 connected to the summing node 817 operating in conjunction with the inductors 816, which may operate as low pass filter. Feedback signals 824 may be provided from the common output 822 and the summing node 817 to the loop filter 810.

A proportional integral derivative (PID) controller may be implemented in the digital 4-phase wide-band amplifier 800 to continuously calculate an error value as a difference between a measured process variable and a desired set point. Strategically arranged and configured feedback loops may then be employed to adjust and control variables to reach the desired set point. An inner feedback loop may be arranged between the common output and the loop filter 810 and may be configured to provide local feedback for controlling the P (present value of the error, namely large or small) and D (predicted future value of the error based upon its current rate of change) components of the control to the loop filter 810, for example. An outer feedback loop may be arranged between the common output 818 and the input into reconstruction filter, and may be configured to provide DC feedback from a power amplifier as may be related to an output signal at the common output 822 (e.g., a voltage signal related to a voltage output signal).

More details and aspects are mentioned in connection with the examples described above or below. The example shown in FIG. 8 may comprise one or more optional additional features corresponding to one or more aspects mentioned in connection with the proposed concept or one or more examples described above (e.g., FIGS. 1A-7) or below (e.g., FIGS. 9-10).

Some embodiments relate to an envelope tracker for uplink carrier aggregation. For example, a proposed envelope tracker power supply (e.g., amp track) may be used in a wireless transceiver.

The proposed concept may extend DCDC converter based envelope tracker solution by an additional slow DCDC converter and a switch network in such a way that two sets of PAs can be supplied simultaneously. Both sets of PAs can run in APT mode and an arbitrary one can be operated in ET mode, for example. The proposed concept may enable that any PA can run in ET mode and that a software reconfiguration is possible for different use cases.

For example, in an envelope tracker architecture (e.g., Amp Track), the wideband DCDC is not connected to the shift cap anymore. Instead the wideband DCDC output may be fed into the chip. There a switch network can connect the wideband DCDC output either to a first or to a second shift capacitor, for example. Both shift capacitors may be then connected to two separate slow DCDCs. The shift cap not connected to the wideband DCDC can be grounded internally in order to operate the respective slow DCDC-PA combination in APT mode (e.g., FIGS. 1C and 7).

For example, other solutions need two separate tracker chips which would require significantly more area on the printed circuit board. If both an APT DCDC and a tracker are integrated in the same silicon without an architecture according to the proposed concept, it cannot be chosen which of the power amplifiers is operated with envelope tracking. The PAs not connected to the tracker output can only work in APT even if carrier aggregation is turned off for example.

With an architecture according the proposed concept, the complete set of power amplifiers may be split in two sub sets. This may reduce the total capacitance to be driven by each output.

The proposed concept may enable a cost and area optimized platform with uplink carrier aggregation. The concept may be extended to more channels.

The proposed concept may be implemented in high volume products and/or other than high volume architecture, may encompass test systems and design/debug tools that, although used to make products, would themselves be low volume.

Figure 9:
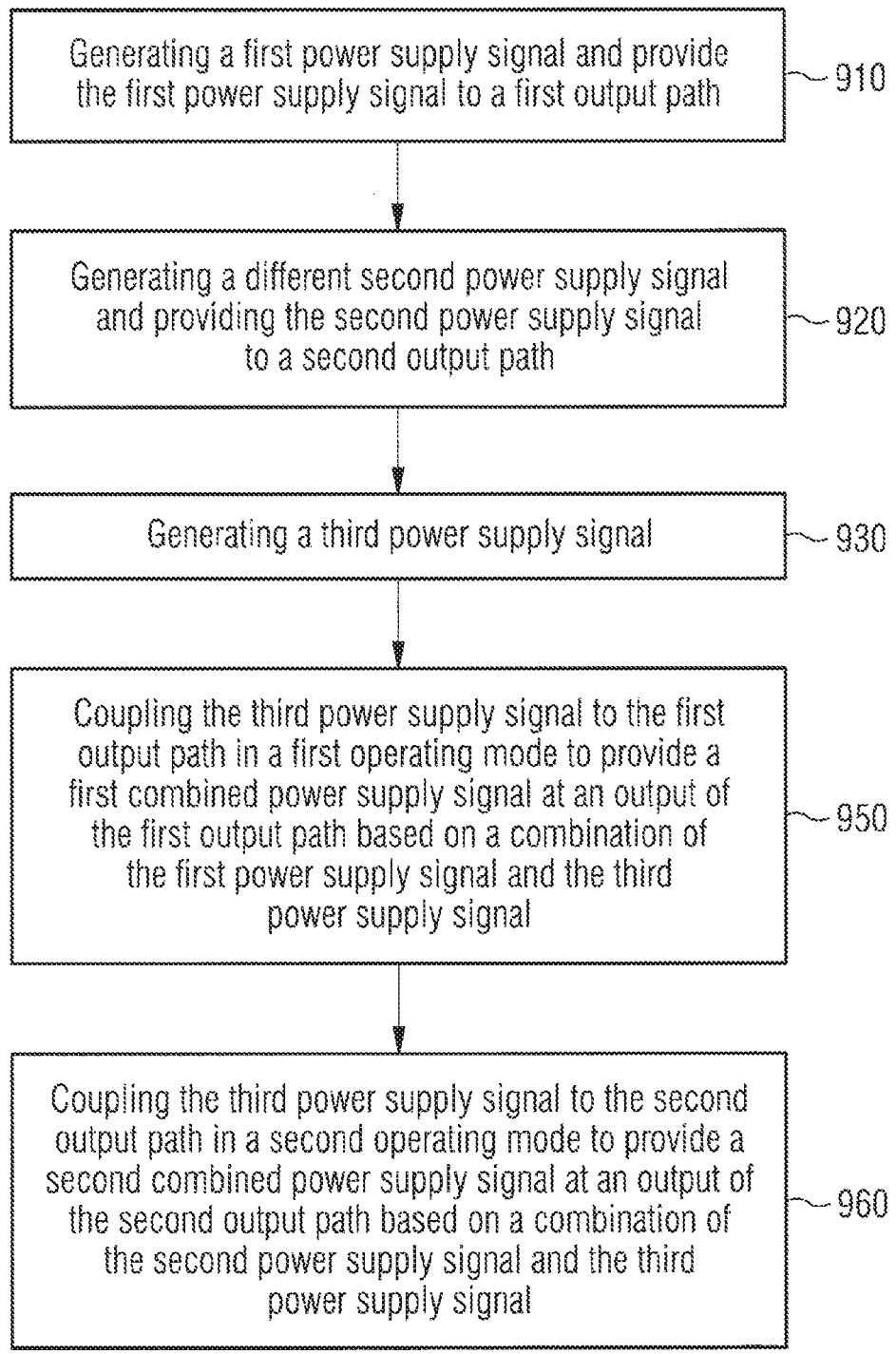
FIG. 9 shows a flowchart of a method for providing a plurality of power supply signals.

FIG. 9 shows a flow chart of a method 900 for generating a plurality of power supply signals for a plurality of power amplifiers configured to amplify radio frequency transmit signals according to an example. The method 900 comprises generating 910 a first power supply signal and provide the first power supply signal to a first output path. Further, the method 900 comprises generating 920 a different second power supply signal and providing the second power supply signal to a second output path. Additionally, the method 900 comprises generating 930 a third power supply signal and coupling 940 the third power supply signal to the first output path in a first operating mode to provide a first combined power supply signal at an output of the first output path based on a combination of the first power supply signal and the third power supply signal. Further, the method 900 comprises coupling 950 the third power supply signal to the second output path in a second operating mode to provide a second combined power supply signal at an output of the second output path based on a combination of the second power supply signal and the third power supply signal.

The third power supply signal can be provided to the first or second output path. In this way the flexibility of the generation of power supply signals may be improved. For example, a more sophisticated power supply generation may be used for the third power supply signal than for the first and second power supply signal, while being able to use third power supply signal for both output paths at different times.

More details and aspects are mentioned in connection with the examples described above or below. The example shown in FIG. 9 may comprise one or more optional additional features corresponding to one or more aspects mentioned in connection with the proposed concept or one or more examples described above (e.g., FIGS. 1A-8) or below (e.g., FIG. 10).

Figure 10:
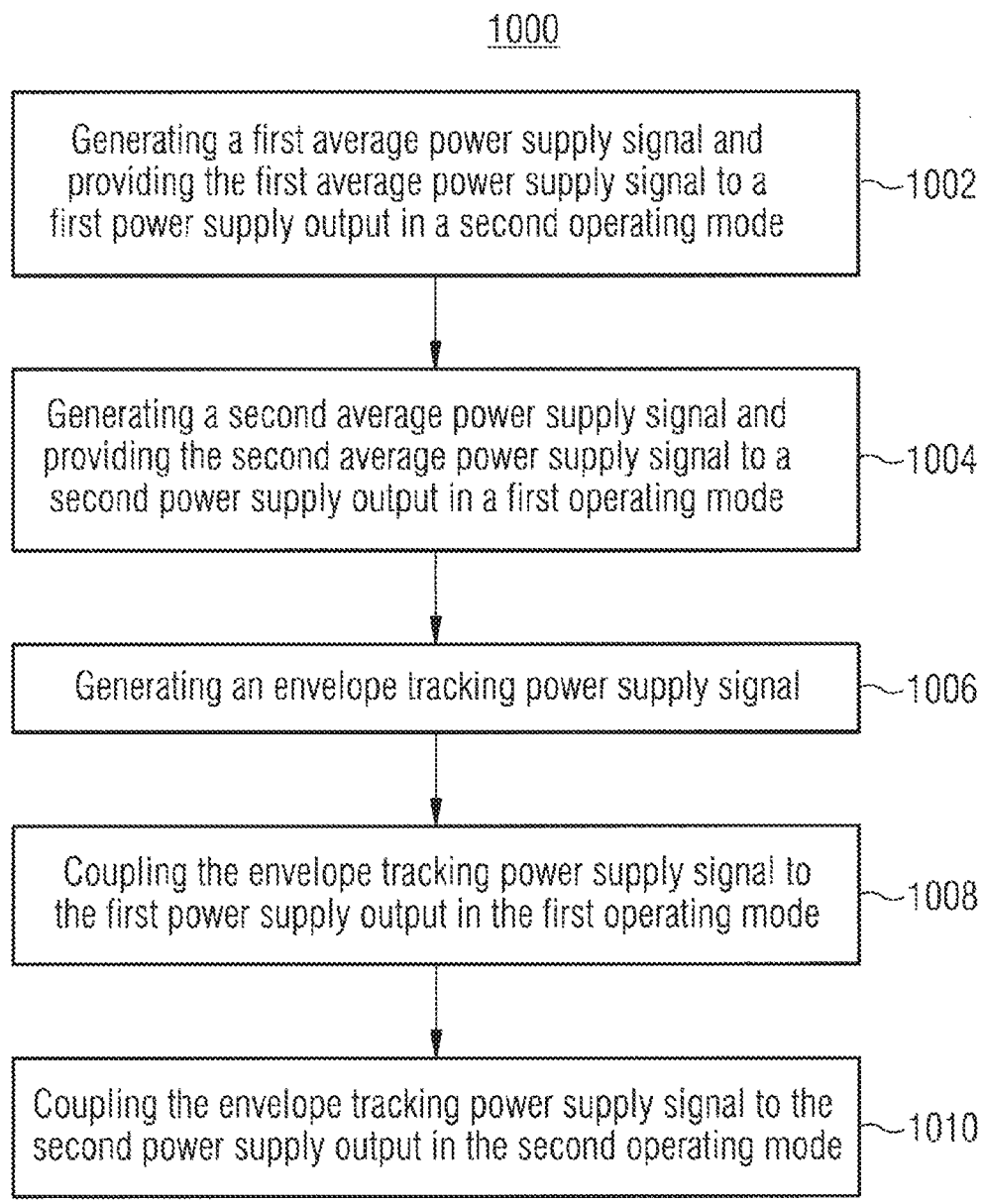
FIG. 10 shows a flowchart of another method for providing a plurality of power supply signals.

FIG. 10 shows a method 1000 for generating a plurality of power supply signals for a plurality of power amplifiers configured to amplify radio frequency transmit signals. The method 1000 includes generating 1002 a first average power supply signal and providing the first average power supply signal to a first power supply output in a second operating mode. Further, the method comprises generating 1004 a second average power supply signal and providing the second average power supply signal to a second power supply output in a first operating mode. Additionally, the method 1000 comprises generating 1006 an envelope tracking power supply signal and coupling 1008 the envelope tracking power supply signal to the first power supply output in the first operating mode. Further, the method 1000 comprises coupling 1010 the envelope tracking power supply signal to the second power supply output in the second operating mode.

The third power supply signal can be coupled to the first or second output path. In this way the flexibility of the generation of power supply signals may be improved. For example, a more sophisticated power supply generation may be used for the envelope tracking power supply signal than for the first average power supply signal and the second average power supply signal. Nevertheless, the envelope tracking power supply signal may be used for both output paths at different times.

More details and aspects are mentioned in connection with the examples described above or below. The example shown in FIG. 10 may comprise one or more optional additional features corresponding to one or more aspects mentioned in connection with the proposed concept or one or more examples described above (e.g., FIGS. 1A-9) or below.

In the following, examples pertain to further examples. Example 1 is apparatus for generating a plurality of power supply signals for a plurality of power amplifiers configured to amplify radio frequency transmit signals, the apparatus comprising: a first power supply circuit configured to generate a first power supply signal and a different second power supply signal, wherein the first power supply circuit is configured to provide the first power supply signal to a first output path and the second power supply signal to a second output path; a second power supply circuit configured to generate a third power supply signal; and a switching circuit configured to couple the second power supply circuit to the first output path in a first operating mode to provide a first combined power supply signal at an output of the first output path based on the first power supply signal and the third power supply signal, and to couple the second power supply circuit to the second output path in a second operating mode to provide a second combined power supply signal at an output of the second output path based on the second power supply signal and the third power supply signal.

In example 2, the subject matter of example 1 can optionally include, in the first operating mode, the switching circuit is further configured to decouple the second power supply circuit from the second output path, wherein the first power supply circuit is configured to provide the second power supply signal at the output of the second output path in the first operating mode.

In example 3, the subject matter of examples 1-2 can optionally include, in the second operating mode, the switching circuit is further configured to decouple the second power supply circuit from the first output path, wherein the first power supply circuit is configured to provide the first power supply signal at the output of the first output path in the second operating mode.

In example 4, the subject matter of examples 1-3 can optionally include, in the first operating mode the first power supply signal is a current signal, the second power supply signal is a voltage signal and the third power supply signal is a voltage signal.

In example 5, the subject matter of examples 1-4 can optionally include, in the second operating mode the first power supply signal is a voltage signal, the second power supply signal is a current signal and the third power supply signal is a voltage signal.

In example 6, the subject matter of examples 1-5 can optionally include, the switching circuit is further configured to decouple the second power supply circuit from the first output path and the second output path in a third operating mode, wherein the first power supply circuit is configured to provide the first power supply signal to the output of the first output path and the second power supply signal to the output of the second output path.

In example 7, the subject matter of example 6 can optionally include, in the third operating mode the first power supply signal is a voltage signal and the second power supply signal is a voltage signal.

In example 8, the subject matter of examples 1-7 can optionally include, the first combined power supply signal and the second combined power supply signal are envelope tracking power supply signals.

In example 9, the subject matter of examples 1-8 can optionally include, the switching circuit further comprises a first switching structure arranged in a first connecting path between the second power supply circuit and the first output path, wherein the first switching structure is configured to couple the second power supply circuit to the first output path in the first operating mode.

In example 10, the subject matter of example 9 can optionally include the switching circuit further comprises a second switching structure arranged in a second connecting path between the second power supply circuit and the second output path, wherein the second switching structure is configured to couple the second power supply circuit to the second output path in the second operating mode.

In example 11, the subject matter of example 10 can optionally include the first connecting path and the second connecting path share a common connecting path portion between the second power supply circuit and at least one of the first switching structure and the second switching structure.

In example 12, the subject matter of example 11 can optionally include the switching circuit further comprises a third switching structure arranged in the common connecting path portion, wherein the third switching structure is configured to switch the common connecting path portion to a reference potential.

In example 13, the subject matter of examples 9-12 can optionally include a first capacitor arranged in the first connecting path and a second capacitor arranged in the second connecting path.

In example 14, the subject matter of examples 9-13 can optionally include a first inductor arranged in the first output path between the first power supply circuit and a node connecting the first output path and the first connecting path and a second inductor arranged in the second output path between the first power supply circuit and a another node connecting the second output path and the second connecting path.

In example 15, the subject matter of examples 1-1.4 can optionally include a multiplexer configured to: receive a first target envelope signal associated to a signal to be transmitted through a first transmit path and a second target envelope signal associated to a signal to be transmitted through a second transmit path; and provide the first target envelope signal or the second target envelope signal to the second power control circuit to control the voltage of the third power supply signal.

In example 16, the subject matter of examples 1-15 can optionally include the first power supply circuit being configured to generate the first power supply signal and the second power supply signal based on switching amplification circuits triggered by switching signals with frequencies lower than 15 megahertz.

In example 17, the subject matter of examples 1-16 can optionally include the second power supply circuit is configured to generate the third power supply signal based on a switching amplification circuit triggered by a switching signal with a frequency higher than 50 megahertz.

In example 18, the subject matter of examples 1-17 can optionally include a register coupled to the switching circuit and configured to set parameters defining modes of operation.

In example 19, the subject matter of examples 1-18 can optionally include a task list processor coupled to the switching circuit and configured to run control programs controlling configuration of the modes of operation.

In example 20, the subject matter of examples 1-19 can optionally include a sequencer coupled to the switching circuit and configured to organize acts for the modes of operation.

In example 21, the subject matter of examples 1-20 can optionally include the output of the first output path is connected to a power supply input of at least one power amplifier of a first transmit path and the output of the second output path is connected to at least one power supply input of a power amplifier of a second transmit path.

In example 22, the subject matter of examples 1-21 can optionally include the first power supply circuit comprises a first DCDC converter configured to generate the first power supply signal based on a first power control signal and a second DCDC converter configured to generate the second power supply signal based on a second power control signal.

In example 23, the subject matter of example 22 can optionally include the first DCDC converter and the second DCDC converter are buck converters.

In example 24, the subject matter of example 22 can optionally include the first DCDC converter and the second DCDC converter are buck-boost converters.

In example 25, the subject matter of example 22 can optionally include the first DCDC converter and the second DCDC converter are buck converters with multiple input supply voltages.

Optionally, the first power supply signal and the second power supply signal are generated by a single inductor multiple output dcdc converter.

In example 26, the subject matter of examples 1-25 can optionally include the second power supply circuit comprises a multi-phase DCDC converter.

Optionally, the second power supply circuit comprises a wideband amplifier.

Further optionally, the second power supply circuit comprises a charge pump based amplifier.

In example 27, the subject matter of examples 1-26 can optionally include the first power supply signal and the second power supply signal are average power tracking power supply signals and the third power supply signal is an envelope tracking power supply signal.

In example 28, the subject matter of examples 1-26 can optionally include the first power supply signal and the second power supply signal are DC signals, and the third power supply signal is an AC signal.

In example 29, the subject matter of examples 1-28 can optionally include at least a part of the first power supply circuit, at least a part of second power supply circuit and at least a part of switching circuit are arranged on a same semiconductor die.

In example 30, the subject matter is an apparatus for generating a plurality of power supply signals for a plurality of power amplifiers configured to amplify radio frequency transmit signals, the apparatus comprising: a first average power supply circuit connected to a first power supply output and configured to generate a first average power supply signal; a second average power supply circuit connected to a second power supply output and configured to generate a second average power supply signal; an envelope tracking power supply circuit configured to generate an envelope tracking power supply signal; and a switching circuit configured to couple the envelope tracking power supply circuit to the first power supply output in a first operating mode to provide an envelope tracking power supply signal combined with the first average power supply signal at the first power supply output, wherein the switching circuit is configured to couple the envelope tracking power supply circuit to the second power supply output in a second operating mode to provide an envelope tracking power supply signal combined with the second average power supply signal at the second power supply output.

In example 31, the subject matter of example 30 can optionally include in the first operating mode, the switching circuit is further configured to decouple the second power supply circuit from the second output path, wherein the first power supply circuit is configured to provide the second average power supply signal at the output of the second output path in the first operating mode.

In example 32, the subject matter of examples 30-31 can optionally include in the second operating mode, the switching circuit is further configured to decouple the second power supply circuit from the first output path, wherein the first power supply circuit is configured to provide the first average power supply signal at the output of the first output path in the second operating mode.

In example 33, the subject matter of examples 30-32 can optionally include in the first operating mode the first average power supply signal is a current signal, the second average power supply signal is a voltage signal and the envelope tracking power supply signal is a voltage signal.

In example 34, the subject matter of examples 30-33 can optionally include in the second operating mode the first average power supply signal is a voltage signal, the second average power supply signal is a current signal and the envelope tracking power supply signal is a voltage signal.

In example 35, the subject matter of examples 30-34 can optionally include the switching circuit is further configured to decouple the second power supply circuit from the first output path and the second output path in a third operating mode, wherein the first power supply circuit is configured to provide the first average power supply signal to the output of the first output path and the second average power supply signal to the output of the second output path.

In example 36, the subject matter of examples 30-35 can optionally include the first average power supply circuit being configured to generate the first average power supply signal based on a switching amplification circuit triggered by a switching signal with a frequency lower than 15 megahertz, wherein the second average power supply circuit is configured to generate the second average power supply signal based on a switching amplification circuit triggered by a switching signal with a frequency lower than 15 megahertz.

In example 37, the subject matter of examples 30-36 can optionally include the envelope tracking power supply circuit being configured to generate the envelope tracking power supply signal based on a switching amplification circuit triggered by a switching signal with a frequency higher than 50 megahertz.

In example 38, is an apparatus for generating a plurality of power supply signals for a plurality of power amplifiers configured to amplify radio frequency transmit signals, the apparatus comprising: first means for generating power supply signals configured to generate a first power supply signal and a different second power supply signal, wherein the first power supply circuit is configured to provide the first power supply signal to a first output path and the second power supply signal to a second output path; second means for generating power supply signals configured to generate a third power supply signal; and means for switching configured to couple the second means for generating power supply signals to the first output path in a first operating mode to provide a first combined power supply signal at an output of the first output path based on the first power supply signal and the third power supply signal, and to couple the second means for generating power supply signals to the second output path in a second operating mode to provide a second combined power supply signal at an output of the second output path based on the second power supply signal and the third power supply signal.

In example 39, the subject matter of example 38 can optionally include the voltage or current of the first power supply signal and the second power supply signal changes with a frequency lower than 15 megahertz.

In example 40, the subject matter of examples 38-39 can optionally include the voltage of the third power supply signal changes with a frequency higher than 50 megahertz.

Example 41 is a power supply device comprising the apparatus according to any one of the previous examples.

Example 42 is a transmitter or a transceiver comprising an apparatus according to any one of the previous examples.

Example 43 is a mobile device comprising a transmitter or a transceiver according to example 42.

Example 44 is a cell phone comprising a transmitter or a transceiver according to example 42.

Example 45 is a method for generating a plurality of power supply signals for a plurality of power amplifiers configured to amplify radio frequency transmit signals, the method comprising: generating a first power supply signal and provide the first power supply signal to a first output path; generating a different second power supply signal and providing the second power supply signal to a second output path; generating a third power supply signal; coupling the third power supply signal to the first output path in a first operating mode to provide a first combined power supply signal at an output of the first output path based on the first power supply signal and the third power supply signal; and coupling the third power supply signal to the second output path in a second operating mode to provide a second combined power supply signal at an output of the second output path based on the second power supply signal and the third power supply signal.

In example 46, the subject matter of example 45 can optionally include decoupling the third power supply signal from the second output path in the first operating mode; and providing the second power supply signal at the output of the second output path in the first operating mode.

In example 47, the subject matter of examples 45-46 can optionally include decoupling the third power supply signal from the first output path in the second operating mode; and providing the first power supply signal at the output of the first output path in the second operating mode.

In example 48, the subject matter of examples 45-47 can optionally include the first power supply signal as a current signal, the second power supply signal as a voltage signal and the third power supply signal as a voltage signal the first operating mode.

In example 49, the subject matter of examples 45-48 can optionally include generating the first power supply signal as a voltage signal, the second power supply signal as a current signal and the third power supply signal as a voltage signal in the second operating mode.

In example 50, the subject matter of examples 45-49 can optionally include decoupling the third power supply signal from the first output path and the second output path in a third operating mode; and providing the first power supply signal to the output of the first output path and the second power supply signal to the output of the second output path.

In example 51, the subject matter of example 50 can optionally include generating the first power supply signal as a voltage signal and the second power supply signal as a voltage signal in the third operating mode.

In example 52, the subject matter of examples 45-51 can optionally include generating the first combined power supply signal and the second combined power supply signal as envelope tracking power supply signals.

In example 53, the subject matter of examples 45-52 can optionally include receiving a first target envelope signal associated to a signal to be transmitted through a first transmit path and a second target envelope signal associated to a signal to be transmitted through a second transmit path; and providing the first target envelope signal or the second target envelope signal to control the voltage of the third power supply signal.

In example 54, the subject matter of examples 45-53 can optionally include setting parameters defining modes of operation.

In example 55, the subject matter of examples 45-54 can optionally include running control programs controlling configuration of the modes of operation.

In example 56, the subject matter of examples 45-55 can optionally include organizing acts for the modes of operation.

In example 57, the subject matter of examples 45-56 can optionally include providing the output of the first output path to a power supply input of at least one power amplifier of a first transmit path and the output of the second output path to a power supply input of at least one power amplifier of a second transmit path.

In example 58, the subject matter of examples 45-57 can optionally include generating the first power supply signal and the second power supply signal as average power tracking power supply signals; and generating the third power supply signal as an envelope tracking power supply signal.

In example 59, the subject matter of examples 45-58 can optionally include generating the first power supply signal and the second power supply signal as DC signals; and generating the third power supply signal as an AC signal.

Example 60, is a method for generating a plurality of power supply signals for a plurality of power amplifiers configured to amplify radio frequency transmit signals, the method comprising: generating a first average power supply signal and providing the first average power supply signal to a first power supply output in a second operating mode; generating a second average power supply signal and providing the second average power supply signal to a second power supply output in a first operating mode;

In example 61, the subject matter of examples 60 can optionally include the first average power supply signal being generated based on a switching amplification circuit triggered by a switching signal with a frequency lower than 15 megahertz, wherein the second average power supply signal is generated based on a switching amplification circuit triggered by a switching signal with a frequency lower than 15 megahertz.

In example 62, the subject matter of examples 60-61 can optionally include the envelope tracking power supply signal being generated based on a switching amplification circuit triggered by a switching signal with a frequency higher than 50 megahertz.

Example 63 is a machine readable storage medium including program code, when executed, to cause a machine to perform the method of example 45.

Examples may further provide a computer program having a program code for performing one of the above methods, when the computer program is executed on a computer or processor. A person of skill in the art would readily recognize that steps of various above described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated, that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for something". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for generating a plurality of power supply signals for a plurality of power amplifiers configured to amplify radio frequency transmit signals, the apparatus comprising:
a first power supply circuit configured to generate a first power supply signal and a second power supply signal that is different from the first power supply signal, wherein the first power supply circuit is configured to provide the first power supply signal to a first output path and the second power supply signal to a second output path;
a third power supply circuit configured to generate a third power supply signal; and
a switching circuit configured to couple the third power supply circuit to the first output path in a first operating mode to provide a first combined power supply signal at an output of the first output path based on the first power supply signal and the third power supply signal, and to couple the third power supply circuit to the second output path in a second operating mode to provide a second combined power supply signal at an output of the second output path based on the second power supply signal and the third power supply signal.

2. The apparatus according to claim 1, wherein, in the first operating mode, the switching circuit is further configured to decouple the third power supply circuit from the second output path, wherein the first power supply circuit is configured to provide the second power supply signal at the output of the second output path in the first operating mode.

3. The apparatus according to claim 1, wherein, in the second operating mode, the switching circuit is further configured to decouple the third power supply circuit from the first output path, wherein the first power supply circuit is configured to provide the first power supply signal at the output of the first output path in the second operating mode.

4. The apparatus according to claim 1, wherein in the first operating mode the first power supply signal is a current signal, the second power supply signal is a voltage signal and the third power supply signal is a voltage signal.

5. The apparatus according to claim 1, wherein in the second operating mode the first power supply signal is a voltage signal, the second power supply signal is a current signal and the third power supply signal is a voltage signal.

6. The apparatus according to claim 1, wherein the switching circuit is further configured to decouple the third power supply circuit from the first output path and the second output path in a third operating mode, wherein the first power supply circuit is configured to provide the first power supply signal to the output of the first output path and the second power supply signal to the output of the second output path.

7. The apparatus according to claim 6, wherein in the third operating mode the first power supply signal is a voltage signal and the second power supply signal is a voltage signal.

8. The apparatus according to claim 1, wherein the first combined power supply signal and the second combined power supply signal are envelope tracking power supply signals.

9. The apparatus according to claim 1, wherein the switching circuit further comprises a first switching structure arranged in a first connecting path between the third power supply circuit and the first output path, wherein the first switching structure is configured to couple the third power supply circuit to the first output path in the first operating mode.

10. The apparatus according to claim 9, wherein the switching circuit further comprises a second switching structure arranged in a second connecting path between the third power supply circuit and the second output path, wherein the second switching structure is configured to couple the third power supply circuit to the second output path in the second operating mode.

11. The apparatus according to claim 10, wherein the first connecting path and the second connecting path share a common connecting path portion between the third power supply circuit and at least one of the first switching structure and the second switching structure.

12. The apparatus according to claim 11, wherein the switching circuit further comprises a third switching structure arranged in the common connecting path portion, wherein the third switching structure is configured to switch the common connecting path portion to a reference potential.

13. The apparatus according to claim 9, further comprising a first capacitor arranged in the first connecting path and a second capacitor arranged in the second connecting path.

14. The apparatus according to claim 9, further comprising a first inductor arranged in the first output path between the first power supply circuit and a node connecting the first output path and the first connecting path and a second inductor arranged in the second output path between the first power supply circuit and an another node connecting the second output path and the second connecting path.

15. The apparatus according to claim 1, further comprising a multiplexer configured to:
receive a first target envelope signal associated to a signal to be transmitted through a first transmit path and a second target envelope signal associated to a signal to be transmitted through a second transmit path; and
provide the first target envelope signal or the second target envelope signal to the third power supply circuit to control the voltage of the third power supply signal.

16. An apparatus for generating a plurality of power supply signals for a plurality of power amplifiers configured to amplify radio frequency transmit signals, the apparatus comprising:
a first average power supply circuit connected to a first power supply output and configured to generate a first average power supply signal;
a second average power supply circuit connected to a second power supply output and configured to generate a second average power supply signal;
an envelope tracking power supply circuit configured to generate an envelope tracking power supply signal; and
a switching circuit configured to couple the envelope tracking power supply circuit to the first power supply output in a first operating mode to provide an envelope tracking power supply signal combined with the first average power supply signal at the first power supply output, and to couple the envelope tracking power supply circuit to the second power supply output in g second operating mode to provide an envelope tracking power supply signal combined with the second average power supply signal at the second power supply output.

17. The apparatus according to claim 16, wherein, in the first operating mode, the switching circuit is further configured to decouple the envelope tracking power supply circuit from the second output path, wherein the second power supply circuit is configured to provide the second average power supply signal at the output of the second output path in the first operating mode.

18. The apparatus according to claim 16, wherein, in the second operating mode, the switching circuit is further configured to decouple the envelope tracking, power supply circuit from the first output path, wherein the first power supply circuit is configured to provide the first average power supply signal at the output of the first output path in the second operating mode.

19. A method for generating a plurality of power supply signals for a plurality of power amplifiers configured to amplify radio frequency transmit signals, the method comprising:
generating a first power supply signal and provide the first power supply signal to a first output path;
generating a second power supply signal that is different than the first power supply signal and providing the second power supply signal to a second output path;
generating a third power supply signal;
coupling the third power supply signal to the first output path in a first operating mode to provide a first combined power supply signal at an output of the first output path based on the first power supply signal and the third power supply signal; and
coupling the third power supply signal to the second output path in a second operating mode to provide a second combined power supply signal at an output of the second output path based on the second power supply signal and the third power supply signal.

20. A method for generating a plurality of power supply signals for a plurality of power amplifiers configured to amplify radio frequency transmit signals, the method comprising:
generating a first average power supply signal and providing the first average power supply signal to a first power supply output;
generating a second average power supply signal and providing the second average power supply signal to a second power supply output;
generating an envelope tracking power supply signal;
coupling the envelope tracking power supply signal to the first power supply output in a first operating mode; and
coupling the envelope tracking power supply signal to the second power supply output in a second operating mode.

* * * * *

UNITED STATES PATENT AND TRADEMARK OFFICE
CERTIFICATE OF CORRECTION

PATENT NO. : 10,348,247 B2
APPLICATION NO. : 15/352743
DATED : July 9, 2019
INVENTOR(S) : Henzler et al.

It is certified that error appears in the above-identified patent and that said Letters Patent is hereby corrected as shown below:

In the Claims

In Column 28, Line 9, in Claim 16, delete "g" and insert --a-- therefor

In Column 28, Line 21, in Claim 18, delete "tracking," and insert --tracking-- therefor Signed and Sealed this
Fourteenth Day of April, 2020

Andrei Iancu
*Director of the United States Patent and Trademark Office*